United States Patent
Cho

Patent Number: 6,034,898
Date of Patent: Mar. 7, 2000

[54] DYNAMIC RANDOM ACCESS MEMORY FOR INCREASING A DATA OUTPUT DRIVER CURRENT

[75] Inventor: Joo Hwan Cho, Kyoungki-do, Rep. of Korea

[73] Assignee: Hyundai Electronics Industries Co., Ltd., Kyoungki-do, Rep. of Korea

[21] Appl. No.: 09/099,767

[22] Filed: Jun. 19, 1998

[30] Foreign Application Priority Data

Jun. 20, 1997 [KR] Rep. of Korea ..................... 97-26190

[51] Int. Cl.⁷ .................................................. G11C 16/04
[52] U.S. Cl. .................................. 365/189.11; 365/189.05
[58] Field of Search ......................... 365/189.11, 189.05, 365/189.01

[56] References Cited

U.S. PATENT DOCUMENTS

| | | | |
|---|---|---|---|
| 5,428,575 | 6/1995 | Fudeyasu | 365/201 |
| 5,689,462 | 11/1997 | Proebsting | 365/189.05 |
| 5,708,614 | 1/1998 | Koshikawa | 365/201 |

*Primary Examiner*—David Nelms
*Assistant Examiner*—Hoai V. Ho
*Attorney, Agent, or Firm*—Thelen Reid & Priest, LLP

[57] ABSTRACT

A DRAM for increasing a data output driver current shares pull-up transistors and pull-down transistors of the unused 8 data output buffers with other pull-up transistors and other pull-down transistors of the used 8 data output buffers, for example 8 pins are used in a product having 16 data pins, thereby increasing a data output driver current.

4 Claims, 3 Drawing Sheets

DYNAMIC RANDOM ACCESS MEMORY FOR INCREASING A DATA OUTPUT DRIVER CURRENT

BACKGROUND OF THE INVENTION

1. Field of the Invention

The present invention relates to a dynamic random access memory (hereinafter referred to as a DRAM). More particularly, it relates to a DRAM for increasing a data output driver current which shares pull-up transistors and pull-down transistors of the unused 8 data output buffers with other pull-up transistors and other pull-down transistors of the used 8 data output buffers, in case that 8 pins are only used in a product having 16 data pins.

2. Description of the Prior Art

In general, in order to manufacture various products in a DRAM, the number of data inputs or the number of data outputs is controlled by using a bonding option or a metal option. For example, 16M DRAM determines whether the number of data is set to 8 (i.e., it is indicated as a mark x8) or 16 (i.e., it is indicated as another mark x16) in one chip by using the bonding option or the metal option.

In this case, 16 data bus lines are basically needed to the inside of the chip, and 16 data pins are also needed thereto. That is, 16 data bus lines and 16 data pins are all used in the case x16, but 8 data bus lines and 8 data pins are selectively used among them in the other case x8.

FIG. 1 depicts a data path of DRAM having 16 data output pins (i.e., x16). As shown in FIG. 1, one data output buffer is connected to each data output pin DQi. Each data output buffer includes a read transmission circuit 12 which receives a read data from a data bus sense amplifier 11 as an input, and controls an operation of the data output buffer.

In this case, 16 data pins are all used in case x16, or 8 data pins among the 16 data pins are selectively used in case x8.

However, in the aforementioned DRAM, the most general method for increasing a data output drive current IOL/IOH is to increase the sizes of the last pull-up transistor and the last pull-down transistor. In this case, the size of a chip increases by an increase of the layout area. If a first peak current consumed while a first product x16 outputs 16 data is compared with a second peak current consumed while a second product x8 outputs 8 data after the sizes of the last pull-up and pull-down transistors are uniformly enlarged to increase the data output drive current IOL/IOH, the first peak current consumed in the product x16 is about twice the value of the second peak current consumed in the product x8. Accordingly, such peak current may incur a power noise.

SUMMARY OF THE INVENTION

Accordingly, the present invention is directed to a DRAM for increasing a data output driver current that substantially obviates one or more of the problems due to limitations and disadvantages of the related art.

It is the objective of the present invention to provide a DRAM for increasing a data output driver current which shares pull-up transistors and pull-down transistors of the unused 8 data output buffers with other pull-up transistors and other pull-down transistors of the used 8 data output buffers in cases that 8 pins are used in a product having 16 data pins.

To achieve the above objective in a memory device which includes: first to 2N-th data bus sense amplifiers which sense and amplify data transmitted from data bus lines; first to 2N-th read data transmitters for receiving output signals of the first to 2N-th data bus sense amplifiers; and first to 2N-th data output drivers which are made of pull-up and pull-down transistors and receive output signals of first to 2N-th read data transmitters, whereby output lines of the first to 2N-th data output drivers are connected to first to 2N-th data output pins, the memory device (for example, DRAM) for increasing a data output driver current according to the present invention includes:

a plurality of first switching means which sequentially connect output lines of even data bus sense amplifiers among the first to 2N-th data bus sense amplifiers to input lines of even read data transmitters among the first to 2N-th read data transmitters;

a plurality of second switching means which sequentially connect input lines of odd read data transmitters among the first to 2N-th read data transmitters to input lines of even read data transmitters among the first to 2N-th read data transmitters; and a plurality of third switching means which sequentially connect output lines of odd data output drivers among the first to 2N-th data output drivers to output lines of even data output drivers among the first to 2N-th data output drivers, the first to third switching means are controlled by a common control signal;

if the common control signal is at a first logic state, the first switching means are turned on and the second to third switching means are turned off, thus the first to 2N-th data output drivers are one-to-one connected to the first to 2N-th data output pins; and if the common control signal is at a second logic state, the first switching means are turned off and the second to third switching means are turned on, thus pull-up and pull-down transistors of the data output drivers are shared, thereby improving a current driving ability.

The first switching means are made of n-channel metal-oxide semiconductor (hereinafter referred to as NMOS) transistors, and the second and third switching means are made of p-channel metal-oxide semiconductor (PMOS) transistors.

Additional features and advantages of the invention will be set forth in the description which follows, and in part will be apparent from the description, or may be learned by practice of the invention. The objective and other advantages of the invention will be realized and attained by the structure emphasized in the written description and claims hereof as well as the appended drawings.

It is to be understood that both the foregoing general description and the following detailed description are exemplary and are intended to provide further explanation of the invention as claimed.

BRIEF DESCRIPTION OF THE ATTACHED DRAWINGS

The accompanying drawings, which are included to provide a further understanding of the invention and constitute a part of this specification, illustrate embodiments of the invention.

DETAILED DESCRIPTION OF THE PREFERRED EMBODIMENTS

Reference will now be made in detail to the preferred embodiments of the present invention, examples of which are illustrated in the accompanying drawings.

Figure 1:
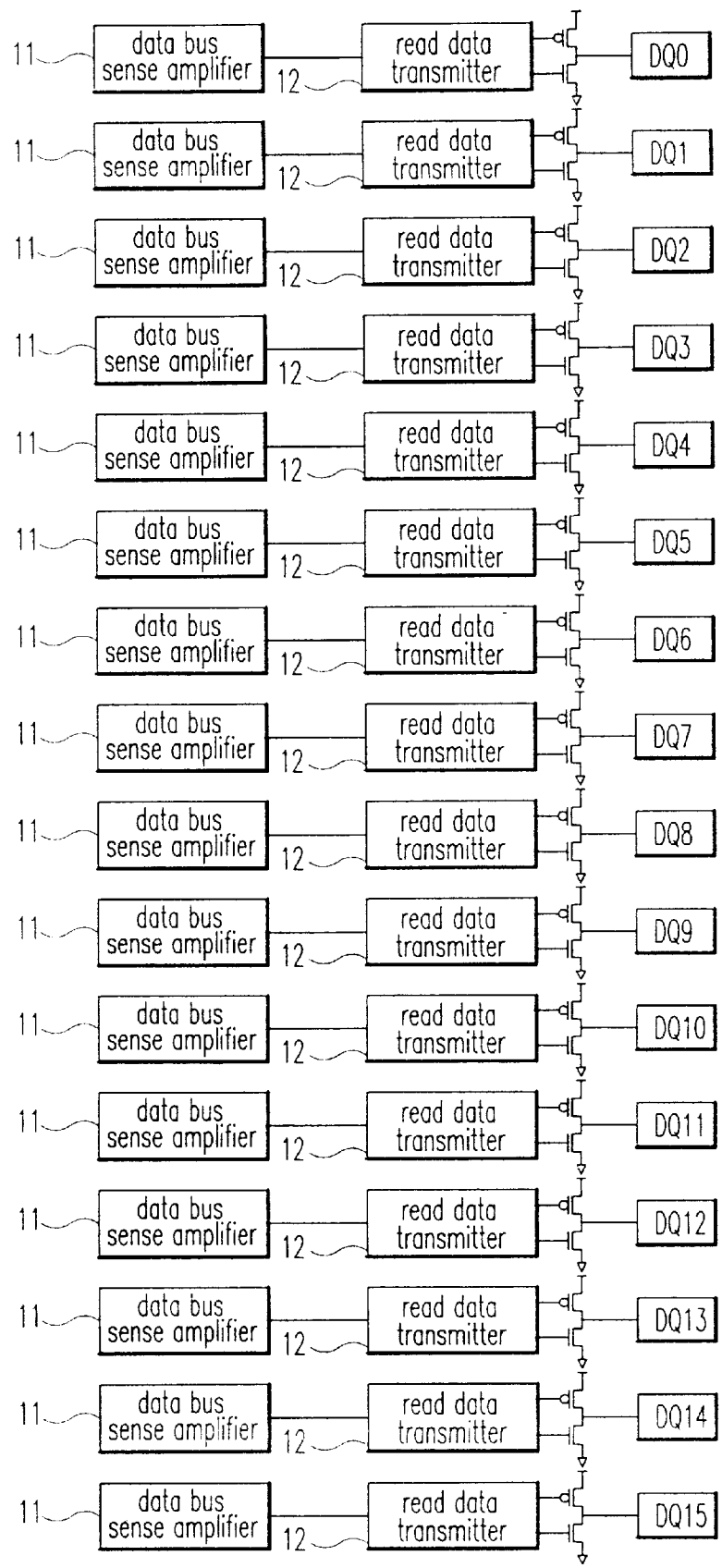
FIG. 1 depicts a data path of a conventional x16 DRAM having 16 data output pins.
Figure 2:
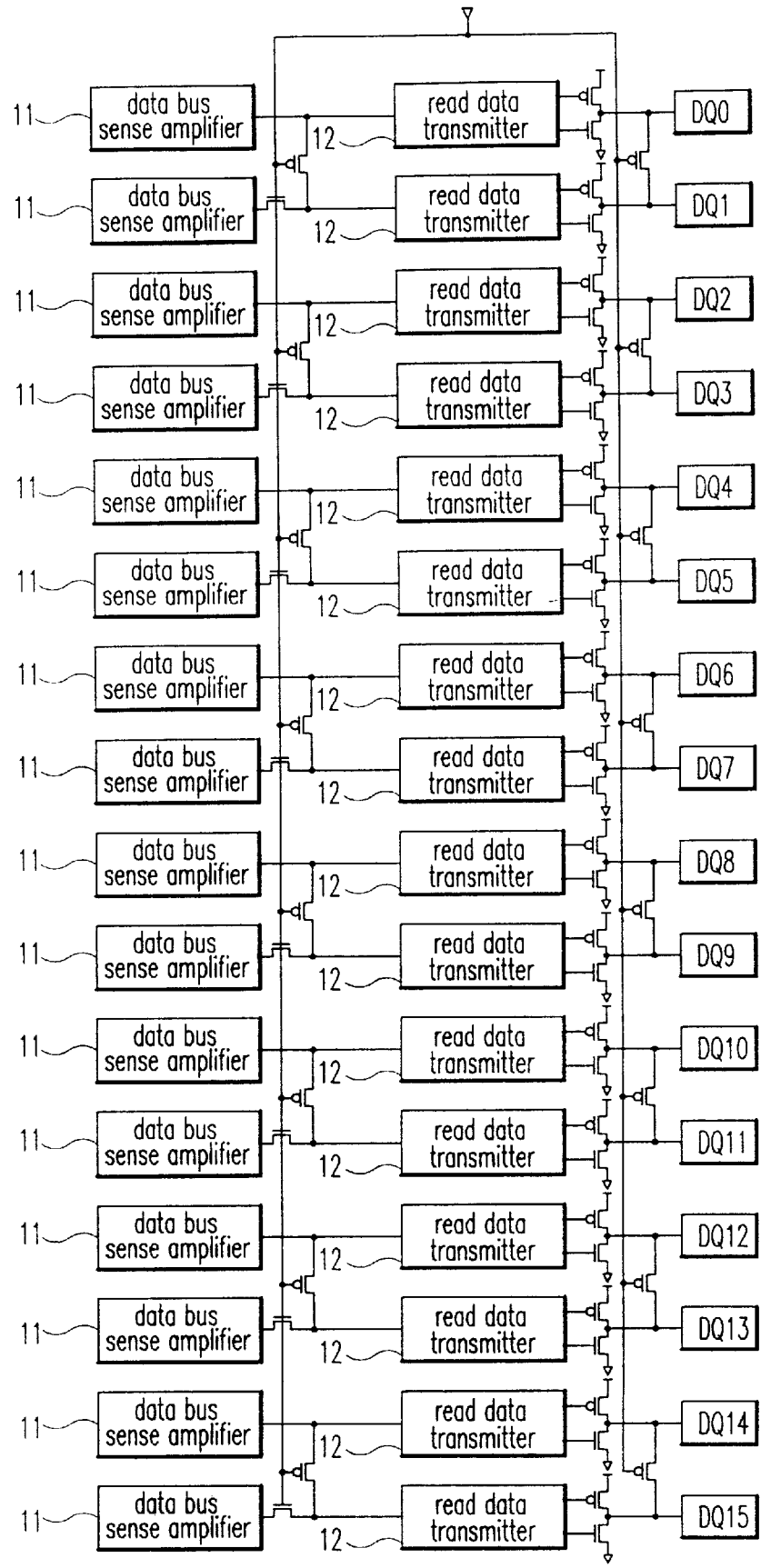
FIG. 2 depicts a block diagram of DRAM in accordance with a preferred embodiment of the present invention.
Figure 3:
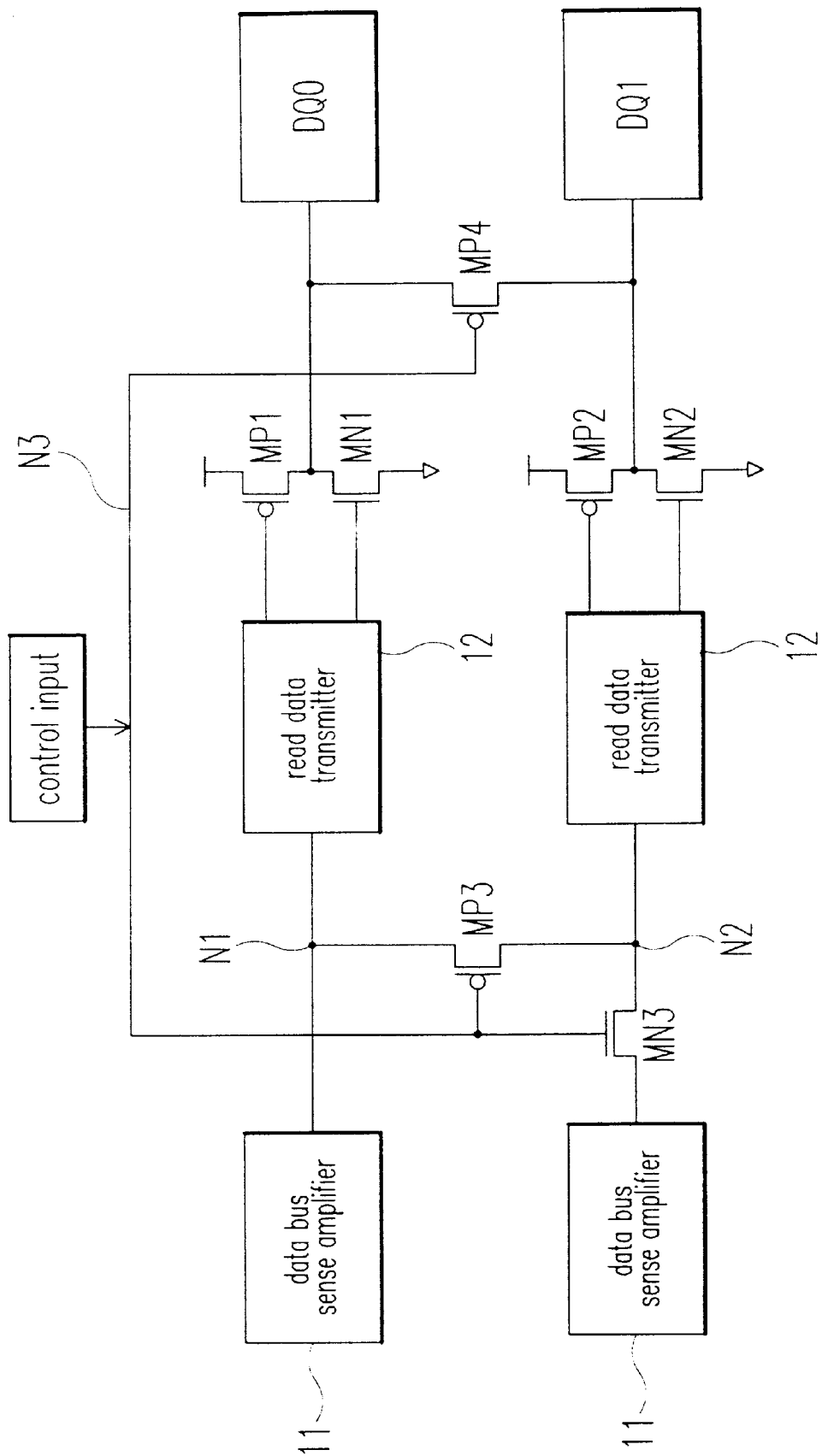
FIG. 3 partially depicts in detail the DRAM shown in FIG. 2.

FIG. 2 depicts a block diagram of DRAM in accordance with a preferred embodiment of the present invention; and FIG. 3 partially depicts in detail the DRAM shown in FIG. 2.

The DRAM shown in FIG. 2 includes:

data input/output pins DQ0–DQ15;

data output buffers which perform a buffering operation to a data signal being inputted to pull-up and pull-down transistors, and output data to the data input/output pins DQ0–DQ15;

data bus sense amplifiers 11 for sensing and amplifying data transmitted to data bus lines;

read data transmitters 12 which receive output signals of the data bus sense amplifiers as an input, and output it to gate terminals of the pull-up and pull-down transistors;

first switching means for switching output lines of even data bus sense amplifiers and input lines of even read data transmitters 12;

second switching means for switching input lines of odd read data transmitters and input lines of even read data transmitters; and third switching means for switching odd data output pins and even data output pins.

In a general DRAM, in order to manufacture various products in a DRAM, the number of data inputs or the number of data outputs is controlled by using a bonding option or a metal option. 16 data bus lines and 16 data pins are all used in case x16, but 8 data bus lines and 8 data pins are selectively used among them in case x8.

As described above, in a conventional DRAM, the product x16 uses 16 data bus lines and 16 data pins, or the product x8 selectively uses 8 data bus lines among 16 data bus lines and 8 data pins among 16 data pins.

However, according to the present invention, in case that 8 pins are used in a product having 16 data pins (i.e., if the product x16 is used as another product x8), the present invention shares pull-up and pull-down transistors and the read lines of the unused 8 data output buffers with other pull-up and pull-down transistors of the used 8 data output buffers by using a switching transistor controlled by a bonding option, thereby increasing a data output drive current.

In the case x8, as shown in FIG. 2, the used data pins are set to DQ0, DQ2, DQ4, DQ6, DQ8, DQ10, DQ12 and DQ14, and the unused data pins are set to DQ1, DQ3, DQ5, DQ7, DQ9, DQ11, DQ13 and DQ15. The product x8 uses switching transistors for sharing the un-selected read lines with the selected read lines and other switching transistors for sharing data pins.

FIG. 3 partially depicts in detail the DRAM shown in FIG. 2.

As shown in FIG. 3, since data is also loaded on a read line of the unused second data output buffer in case x8, pull-up and pull-down transistors connected to the unused output buffer and other pull-up and pull-down transistors connected to the second data output buffer are operated at the same time, thereby making a double driving current at a data output time. That is, if a low level signal is applied to these bonding pads, the data output drive current is doubled. On the contrary, if a high level signal is applied to this bonding pad, an original data output drive current is maintained.

As described above, a DRAM in accordance with a preferred embodiment of the present invention shares pull-up transistors and pull-down transistors of the unused 8 data output buffers with other pull-up transistors and other pull-down transistors of the used 8 data output buffers, for example 8 pins are used in a product having 16 data pins, thereby increasing a data output driver current.

It is understood that various other modifications will be apparent and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art which this invention pertains.

What is claimed is:

1. A memory device which includes:

first to 2N-th data bus sense amplifiers which sense and amplify data transmitted from data bus lines;

first to 2N-th read data transmitters for receiving output signals of the first to 2N-th data bus sense amplifiers; and first to 2N-th data output drivers which are made of pull-up and pull-down transistors and receive output signals of the first to 2N-th read data transmitters, whereby output lines of the first to 2N-th data output drivers are connected to first to 2N-th data output pins, the memory device for increasing a data output driver current comprising:

a) a plurality of first switching means which sequentially connect output lines of even data bus sense amplifiers among the first to 2N-th data bus sense amplifiers to input lines of even read data transmitters among the first to 2N-th read data transmitters;

b) a plurality of second switching means which sequentially connect input lines of odd read data transmitters among the first to 2N-th read data transmitters to input lines of even read data transmitters among the first to 2N-th read data transmitters; and c) a plurality of third switching means which sequentially connect output lines of odd data output drivers among the first to 2N-th data output drivers to output lines of even data output drivers among the first to 2N-th data output drivers; wherein:

the first to third switching means are controlled by a common control signal;

when the common control signal is at a first logic state, the first switching means are turned on and the second to third switching means are turned off; and when the common control signal is at a second logic state, the first switching means are turned off and the second to third switching means are turned on.

2. The device of claim 1, wherein:

the first switching means are made of n-channel metal-oxide semiconductor transistors, and the second and third switching means are made of p-channel metal-oxide semiconductor transistors.

3. The device of claim 1, wherein:

the first to 2N-th data output pins are all used when the common control signals at the first logic state.

4. The device of claim 1, wherein:

odd data output pins among the first to 2N-th data output pins are only used when the common control signal is at the second logic state.

* * * * *